United States Patent
Chang et al.

(10) Patent No.: US 9,645,610 B1
(45) Date of Patent: May 9, 2017

(54) WEARABLE ELECTRONIC DEVICE, MANUFACTURING METHOD AND FIXTURE OF FLEXIBLE CIRCUIT BOARD

(71) Applicant: Quanta Computer Inc., Taoyuan (TW)

(72) Inventors: Jung-Wen Chang, Taoyuan (TW); Pao-Hsien Chang, Taoyuan (TW); Chien-Hsien Sung, Taoyuan (TW)

(73) Assignee: QUANTA COMPUTER INC., Guishan Dist., Taoyuan (TW)

( * ) Notice: Subject to any disclaimer, the term of this patent is extended or adjusted under 35 U.S.C. 154(b) by 0 days.

(21) Appl. No.: 15/075,567

(22) Filed: Mar. 21, 2016

(30) Foreign Application Priority Data

Feb. 4, 2016 (TW) .............................. 105201871 U

(51) Int. Cl.
*G06F 1/16* (2006.01)
*H05K 1/02* (2006.01)
*H05K 3/00* (2006.01)

(52) U.S. Cl.
CPC ............. *G06F 1/163* (2013.01); *H05K 1/028* (2013.01); *H05K 3/007* (2013.01); *H05K 3/0008* (2013.01); *H05K 2201/051* (2013.01); *H05K 2201/10151* (2013.01); *H05K 2203/0228* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,581,492 A * | 12/1996 | Janik | .................. | G06F 1/163 361/679.03 |
| 5,774,338 A * | 6/1998 | Wessling, III | .......... | G06F 1/163 2/94 |
| 5,798,907 A * | 8/1998 | Janik | .................. | G06F 1/163 361/679.03 |
| 6,137,675 A * | 10/2000 | Perkins | .................. | G06F 1/163 128/876 |
| 6,619,835 B2 * | 9/2003 | Kita | .................. | A44C 5/0015 368/10 |
| 6,962,277 B2 * | 11/2005 | Quintana | .................. | A45F 3/14 224/262 |
| 7,618,260 B2 * | 11/2009 | Daniel | .................. | A44C 5/0007 24/311 |
| 8,099,794 B2 * | 1/2012 | Carstens | .................. | G06F 1/163 2/16 |
| 8,787,006 B2 * | 7/2014 | Golko | .................. | G06F 1/163 361/679.03 |
| 2014/0337621 A1 * | 11/2014 | Nakhimov | .............. | G06F 1/163 713/168 |

* cited by examiner

*Primary Examiner* — Lisa Lea Edmonds
(74) *Attorney, Agent, or Firm* — McClure, Qualey & Rodack, LLP

(57) ABSTRACT

A wearable electronic device includes an annular housing, a first flexible circuit board and a second flexible circuit board. The first flexible circuit board and the second flexible circuit board are disposed in the annular housing. The second flexible circuit board is fixed on the first flexible circuit board.

19 Claims, 9 Drawing Sheets

WEARABLE ELECTRONIC DEVICE, MANUFACTURING METHOD AND FIXTURE OF FLEXIBLE CIRCUIT BOARD

CROSS-REFERENCE TO RELATED APPLICATIONS

This Application claims priority of Taiwan Patent Application No. 105201871 filed on Feb. 4, 2016, the entirety of which is incorporated by reference herein.

BACKGROUND OF THE INVENTION

Field of the Invention

The present disclosure relates to an electronic device, and a manufacturing method and a fixture of a flexible circuit board, and in particular to a wearable electronic device and a manufacturing method and a fixture of a flexible circuit board for a wearable electronic device.

Description of the Related Art

As technology develops, electronic devices have been integrated into conventional wearable accessories, and can communicate with other portable electronic devices, such as smartphones, to provide users with more convenient features. The wearable electronic devices are mainly integrated with watches or bracelets, and, recently, they have also been integrated with rings, which are smaller in size.

Although existing wearable electronic devices such as rings have been generally adequate for their intended purposes, they have not been entirely satisfactory in all respects. Consequently, it would be desirable to provide a solution for improving the wearable electronic devices.

BRIEF SUMMARY OF THE INVENTION

The present disclosure provides a solution so that circuit boards can be applied to wearable electronic devices various sizes of by not changing the design of the circuit boards. Therefore, the manufacturing cost of the wearable electronic device is decreased.

The present disclosure provides a wearable electronic device including an annular housing, a first flexible circuit board, a first electronic element, a second flexible circuit board, and a second electronic element. The annular housing extends along an annular path, and has a first receiving portion and a second receiving portion separately arranged in the annular path. The first flexible circuit board is disposed in the annular housing. The first electronic element is disposed on the first flexible circuit board, and located in the first receiving portion. The second flexible circuit board is disposed in the annular housing, and fixed on the first flexible circuit board. The second electronic element is disposed on the second flexible circuit board, and located in the second receiving portion. The first electronic element is electrically connected to the second electronic element via the first flexible circuit board and second flexible circuit board.

In some embodiments, the annular housing is surrounding a hollow space, the second receiving portion faces the first receiving portion, and the hollow space is located between the first receiving portion and the second receiving portion. The first flexible circuit board and the second flexible circuit board respectively extend along the annular path, and are arranged in the annular path.

In some embodiments, the first flexible circuit board and the second flexible circuit board are elongated structures. The first flexible circuit board has a first connection end, and the second flexible circuit board has a second connection end fixed on and electrically connected to the first connection end. Moreover, the first flexible circuit board a first free end, the second flexible circuit board has a second free end, and the first free end and the second free end are separate from each other.

In some embodiments, the wearable electronic device further includes electrode terminals disposed on the second flexible circuit board, and electrically connected to the first electronic element. The second electronic element is located between the electrode terminals.

The present disclosure provides a manufacturing method of a flexible circuit board for a wearable electronic device, including putting a first flexible circuit board on a support surface of a support stage, and moving the first flexible circuit board to make a first position pillar on the support surface to be located in a first positioning hole of the first flexible circuit board. The manufacturing method further includes cutting the first flexible circuit board via a cutting tool, when the first flexible circuit board covers or is in contact with a second position pillar of the support surface.

In some embodiments, after the first flexible circuit board is cut by the cutting tool, a distance between the first positioning hole and an end surface of the first flexible circuit board, which is adjacent to the second position pillar, is shorter than or equal to a distance between the first position pillar and the second position pillar.

In some embodiments, putting a second flexible circuit board on the support surface, and moving the second flexible circuit board to make a second position pillar on the support surface to be located in a second positioning hole of the second flexible circuit board. A first connection end of the first flexible circuit board and a second connection end of the second flexible circuit board are overlapped, when both of the first flexible circuit board and the second flexible circuit board are put on the support surface.

The present disclosure provides a fixture of a flexible circuit board for a wearable electronic device, including a support stage, a first position pillar, and a second position pillar. The support stage has a support surface. The first position pillar is disposed on the support surface. The second position pillar is disposed on the support surface. The support stage is configured to support a first flexible circuit board and/or a second flexible circuit board. The first flexible circuit board has a first positioning hole, and the second flexible circuit board has a second positioning hole.

When both of the first flexible circuit board and the second flexible circuit board are put on the support stage, the first position pillar is located in the first positioning hole, the second position pillar is located in the second positioning hole, and a first connection end of the first flexible circuit board and a second connection end of the second flexible circuit board are overlapped.

In some embodiments, the first positioning hole is located at a side of the first flexible circuit board, and the second positioning hole is located at a side of the second flexible circuit board.

In conclusion, using the manufacturing method of the flexible circuit board for the wearable electronic device, the relative positions of the first electronic element and the second electronic element on the annular housing can be adjusted by cutting various length of the first flexible circuit board. Therefore, it is not required to design various first flexible circuit boards of different sizes and circuits for annular housings of various sizes, and thus the manufacturing cost of the wearable electronic device is decreased.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
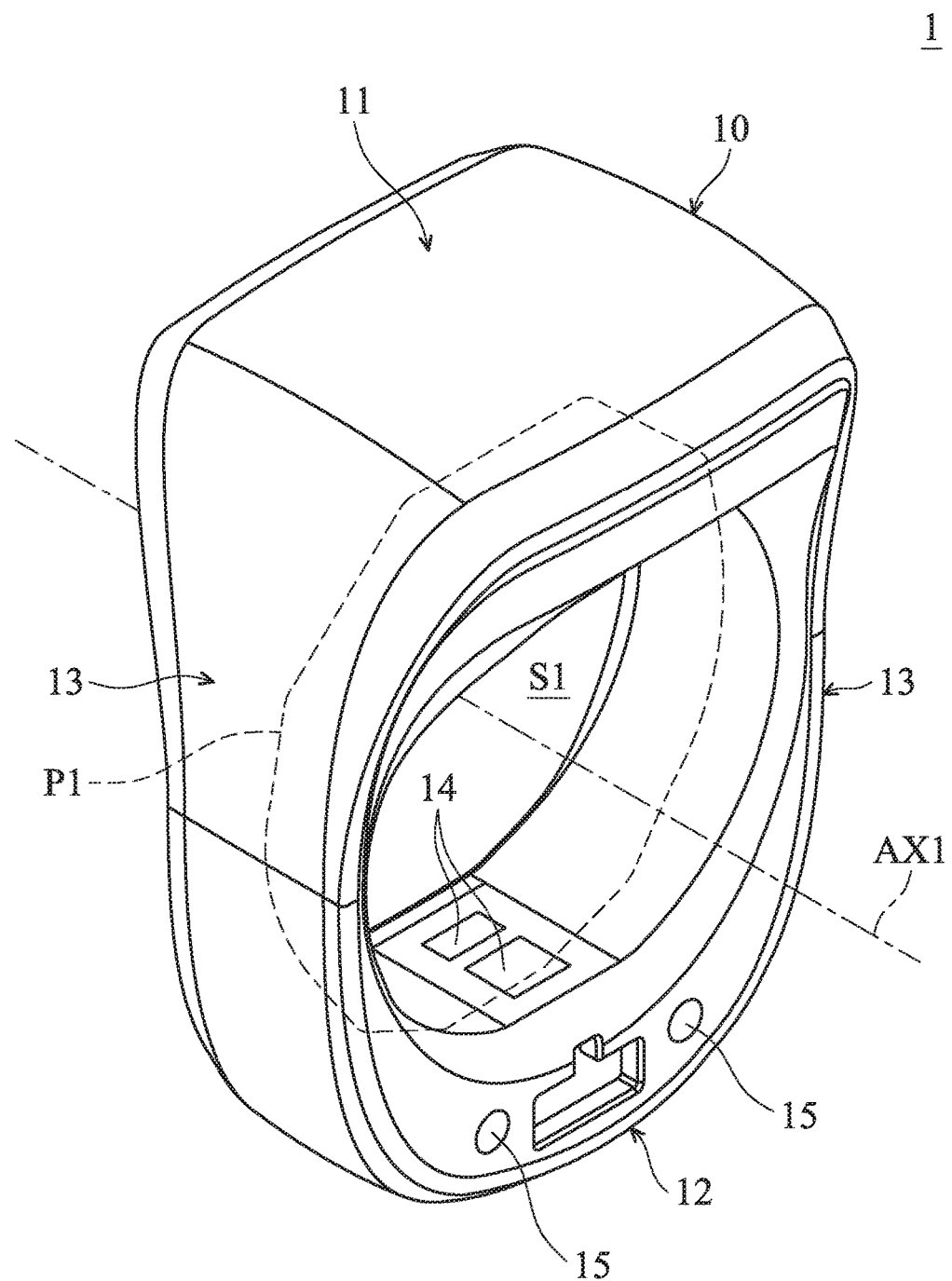
FIG. 1 is a perspective view of a wearable electronic device in accordance with some embodiments of the present disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

Spatially relative terms, such as upper and lower, may be used herein for ease of description to describe one element or feature's relationship to another element(s) or feature(s) as illustrated in the figures. The spatially relative terms are intended to encompass different orientations of the device in use or operation in addition to the orientation depicted in the figures. The shape, size, and thickness in the drawings may not be drawn to scale or simplified for clarity of discussion; rather, these drawings are merely intended for illustration.

Figure 2:
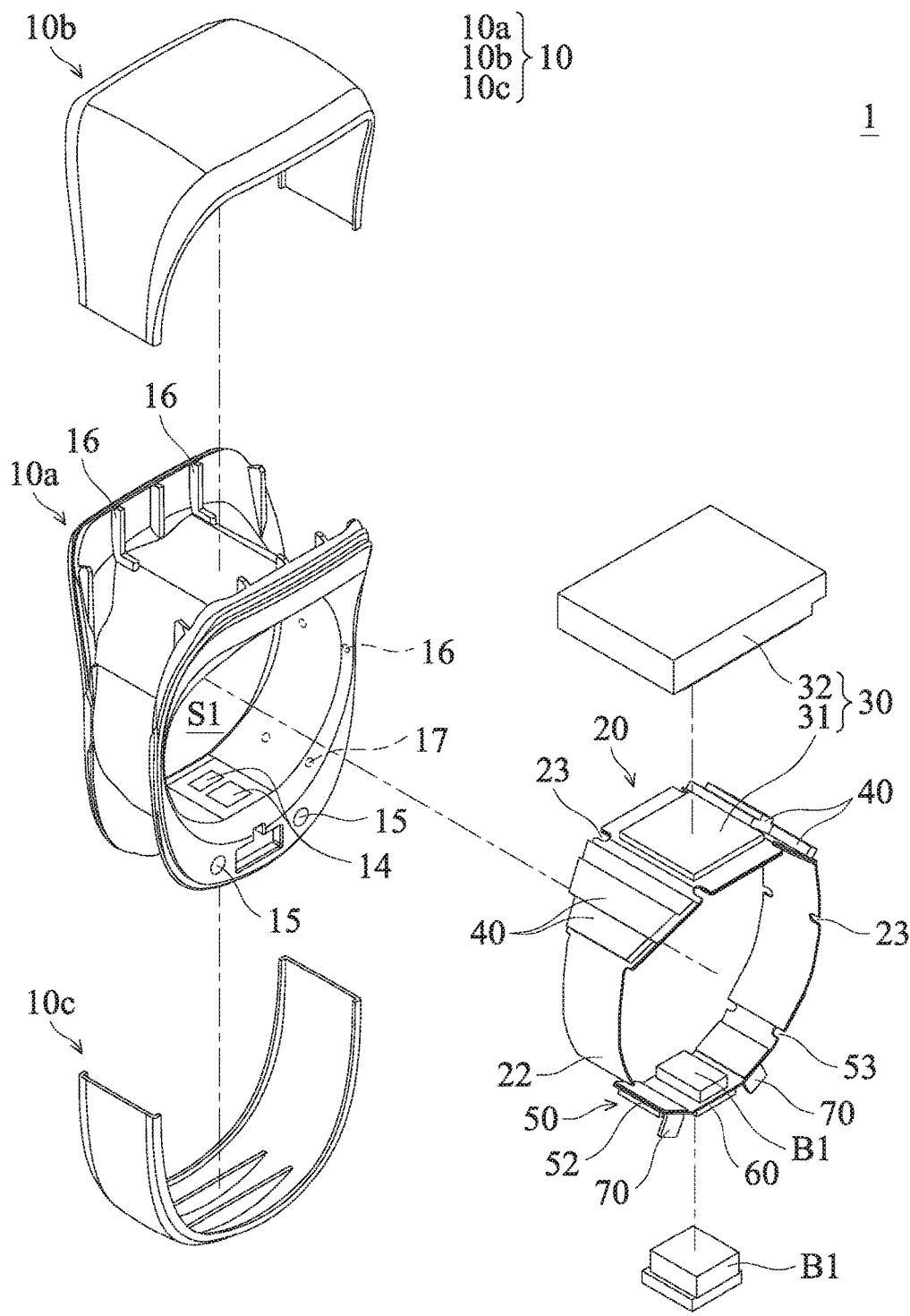
FIG. 2 is an exploded view of the wearable electronic device in accordance with some embodiments of the present disclosure.
Figure 3:
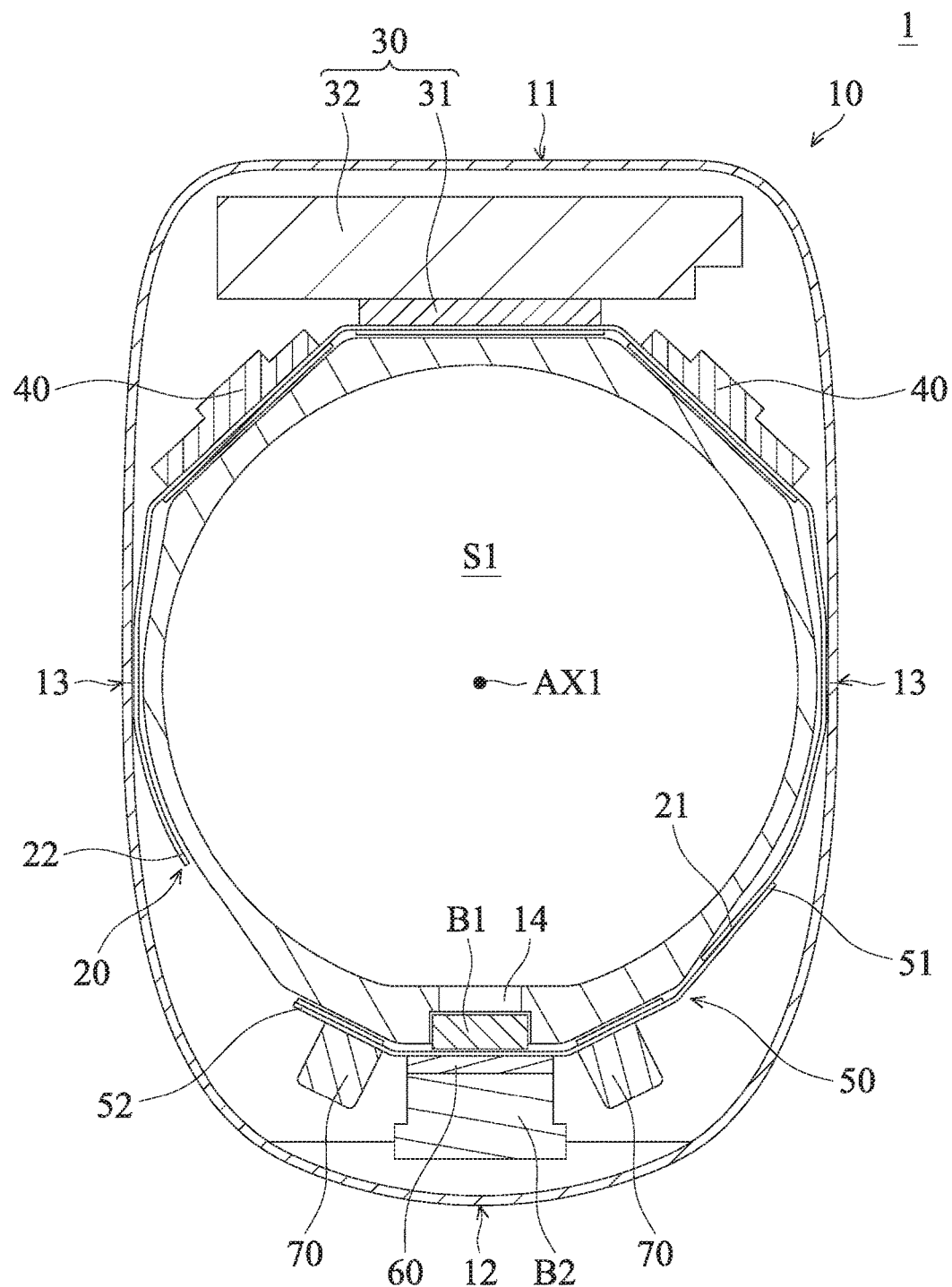
FIG. 3 is a cross-sectional view of the wearable electronic device in accordance with some embodiments of the present disclosure.

FIG. 1 is a perspective view of a wearable electronic device 1 in accordance with some embodiments of the present disclosure. FIG. 2 is an exploded view of the wearable electronic device 1 in accordance with some embodiments of the present disclosure. FIG. 3 is a cross-sectional view of the wearable electronic device 1 in accordance with some embodiments of the present disclosure. The wearable electronic device 1 may be a watch, a bracelet, or a ring. In this embodiment, the wearable electronic device 1 is a ring.

The wearable electronic device 1 includes an annular housing 10, a first flexible circuit board 20, electronic elements 30, electronic elements 40, a second flexible circuit board 50, an electronic element 60, and two electrode terminals 70. The annular housing 10 extends along an annular path P1 (as shown in FIG. 1), and is surrounding a hollow space S1. In this embodiment, a central axis AX1 passes through the center of the hollow space S1, and the annular housing 10 is located on a plane perpendicular to the central axis AX1. In the other words, the annular housing 10 is surrounding the central axis AX1.

As shown in FIG. 2, the annular housing 10 may include housings 10a, 10b, and 10c. In the other words, the annular housing 10 is assembled by the housing 10a, 10b, and 10c. After the elements, such as the first flexible circuit board 20 and the second flexible circuit board 50, are installed on the housing 10a, the housings 10b and 10c are assembled to the housing 10a, and thus the wearable electronic device 1 is assembled completely. In some embodiments, the housings 10a, 10b, and 10c are made from insulated materials, such as plastic. In some embodiments, the housings 10b and 10c are made from metal, and the housing 10a is made from insulated materials, such as plastic.

The annular housing 10 includes a first receiving portion 11, a second receiving portion 12, and two connection portions 13. The first receiving portion 11 faces the second receiving portion 12, and the hollow space S1 and the central axis AX1 are located between the first receiving portion 11 and the second receiving portion 12. Moreover, two connection portions 13 are respectively connected to the first receiving portion 11 and the second receiving portion 12. The hollow space S1 and the central axis AX1 are located between two connection portions 13. In this embodiment, the first receiving portion 11, one connection portion 13, the second receiving portion 12, and the other connection portion 13 are arranged in the annular path P1 in sequence. In the other words, the first receiving portion 11 and the second receiving portion 12 are separately arranged in the annular path P1.

In this embodiment, the thickness of the first receiving portion 11 or the second receiving portion 12 is greater than the thickness of the connection portion 13. The thicknesses are measured along a direction perpendicular to central axis AX1. By the structure of the annular housing 10, the wearable electronic device 1 can be comfortably worn on the finger of the user.

The first flexible circuit board 20 is an elongated structure. The first flexible circuit board 20 is disposed in annular housing 10, and extends along the annular path P1. Each of the electronic elements 30 are respectively disposed on the first flexible circuit board 20, and located in the first receiving portion 11. In this embodiment, each electronic element 30 includes a central processing chip 31 and a cell 32. The central processing chip 31 is disposed on first flexible circuit board 20, and the cell 32 is disposed on the central processing chip 31. In some embodiments, the electronic elements 30 further include resistances and capacitances (not shown in figures).

The electronic elements 40 are disposed on the first flexible circuit board 20. The electronic elements 40 are various sensors, such as G-sensors, charge sensors, or gyroscopes. In this embodiment, the electronic element 40 is located two opposite sides of the electronic elements 30, and located in the first receiving portion 11.

The second flexible circuit board 50 is an elongated structure. The second flexible circuit board 50 is disposed in the annular housing 10, and extends along the annular path P1. The second flexible circuit board 50 is connected to the first flexible circuit board 20, and arranged in the annular path P1.

In this embodiment, the first flexible circuit board 20 has a first connection end 21 and a first free end 22. The second flexible circuit board 50 has a second connection end 51 and a second free end 52. The second connection end 51 is fixed on and electrically connected to the first connection end 21.

The first free end 22 and the second free end 52 are separate from each other. In the other words, the first flexible circuit board 20 and the second flexible circuit board 50 are formed as a C-shaped structure.

The electronic element 60 is disposed on the second flexible circuit board 50, and located in the second receiving portion 12. The electronic elements 30 are electrically connected to the electronic element 60 via the first flexible circuit board 20 and the second flexible circuit board 50.

In this embodiment, the electronic element 60 is a pulse sensor, which is configured to detect the vibrations of blood vessels. When the wearable electronic device 1 is worn on the finger of the user, the electronic element 60 is close to the palm side of the finger. Since there are more blood capillaries on the palm side of the finger, a better detection result can be obtained by the electronic element 60 since the electronic element 60 is close to the palm side of the finger.

In this embodiment, the wearable electronic device 1 further includes a sensing element B1 disposed in the annular housing 10. The sensing element B1 abuts against to the annular housing 10 and the electronic element 60. Moreover, the annular housing 10 has a sensing hole 14. The sensing element B1 corresponds to and is exposed from the sensing hole 14. The electronic element 60 detects the pulses of the blood vessels by the sensing element B1 sensing the vibrations of the blood vessels.

In this embodiment, the wearable electronic device 1 further includes an elastic pad B2 disposed in the annular housing 10. Since the elastic pad B2 abuts against the annular housing 10 and the electronic element 60, the electronic element 60 and the second flexible circuit board 50 are stably disposed in the annular housing 10.

The electrode terminals 70 are disposed on the second flexible circuit board 50, and electrically connected to the cell 32. The electrode terminals 70 can be connected to an external power supply (not shown in figures). The cell 32 receives the power supplied by the external power supply via the electrode terminal 70. In this embodiment, the annular housing 10 further includes openings 15, which correspond to the electrode terminals 70. The external power supply is electrically connected to the electrode terminals 70 via the openings 15.

As shown in FIG. 2, the first flexible circuit board 20 includes first positioning holes 23, and the second flexible circuit board 50 includes two second positioning holes 53. The first positioning holes 23 are located at two opposite sides of the first flexible circuit board 20, and the second positioning holes 53 are located at two opposite sides of the second flexible circuit board 50.

The annular housing 10 has first anchor elements 16 located in the first positioning holes 23, and configured to position the first flexible circuit board 20. The annular housing 10 has second anchor element 17 located in the second positioning holes 53, and configured to position the second flexible circuit board 50.

Figure 4:
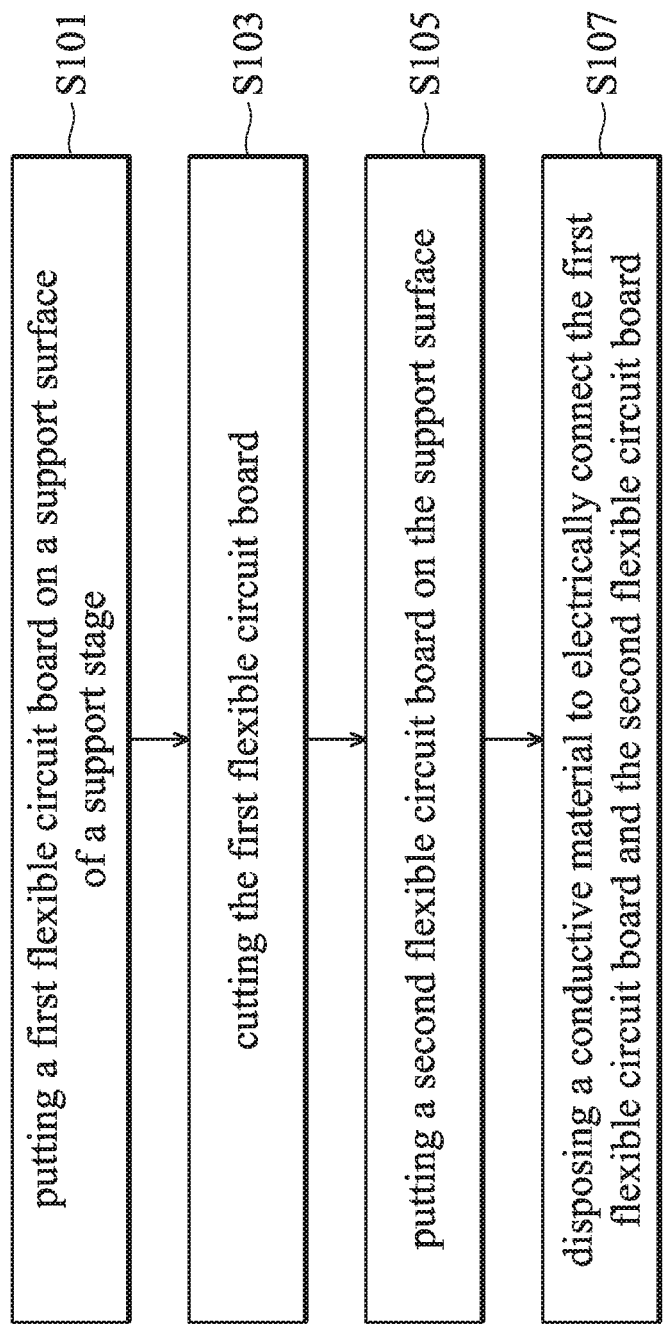
FIG. 4 is a flow chart of a manufacturing method for the flexible circuit board of the wearable electronic device in accordance with some embodiments of the present disclosure.

FIG. 4 is a flow chart of a manufacturing method for the flexible circuit board of the wearable electronic device 1 in accordance with some embodiments of the present disclosure. FIGS. 5A to 5E are schematic views of the manufacturing method for the flexible circuit board of the wearable electronic device 1 during intermediate stages in accordance with some embodiments of the present disclosure. It should be understood that additional operations can be provided before, during, and after the method, and some of the operations described can be replaced or eliminated for other embodiments of the method.

The fixture T1 includes a support stage T10, first position pillars T20, and second position pillars T30. The support stage T10 is configured to support a first flexible circuit board 20 and/or a second flexible circuit board 50. The support stage T10 has a support surface T11, and the first position pillar T20 and the second position pillar T30 are disposed on the support surface T11.

In this embodiment, the support surface T11 is a plane. The first position pillar T20 and the second position pillar T30 extend perpendicular to the support surface T11. Moreover, the fixture T1 includes two first position pillars T20 and two second position pillars T30.

Figure 5A:
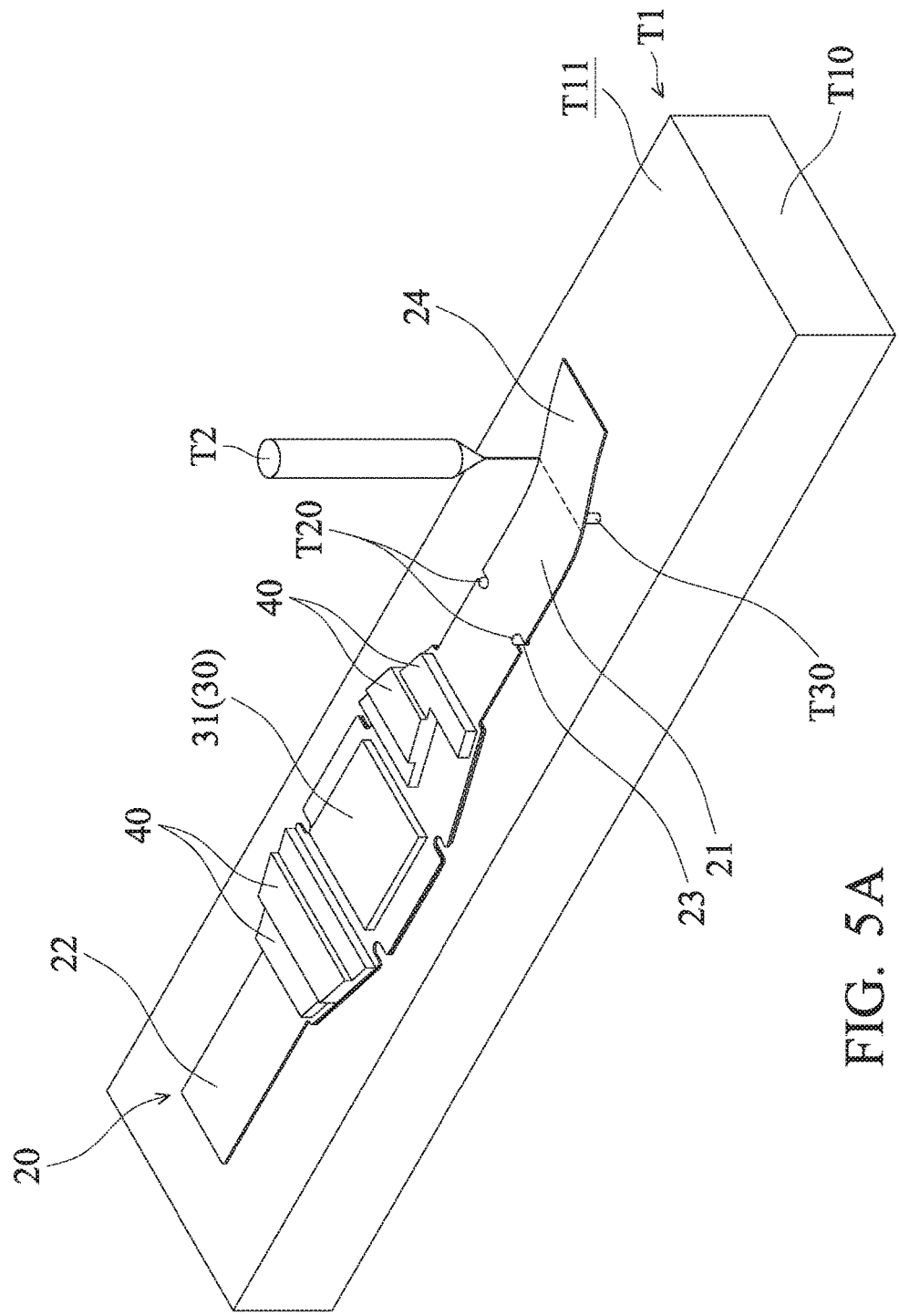
FIGS. 5A to 5E are schematic views of the manufacturing method of the flexible circuit board for the wearable electronic device during intermediate stages in accordance with some embodiments of the present disclosure.

In step S101, as shown in FIG. 5A, the first flexible circuit board 20 is put on the support surface T11 of the support stage T10, and the first flexible circuit board 20 is moved to make the first position pillar T20 on the support surface T11 to be located in the first positioning hole 23. The first position pillar T20 is retained by the first positioning hole 23, and thus the first flexible circuit board 20 is positioned.

In step S103, as shown in FIG. 5A, when the first flexible circuit board 20 covers or is in contact with the second position pillars T30 on the support surface T11, the first flexible circuit board 20 is cut by a cutting tool T2, and thus a cutting portion 24 of the flexible circuit board 20 can be removed. In some embodiments, the cutting tool T2 is a laser cutting tool.

Figure 5B:
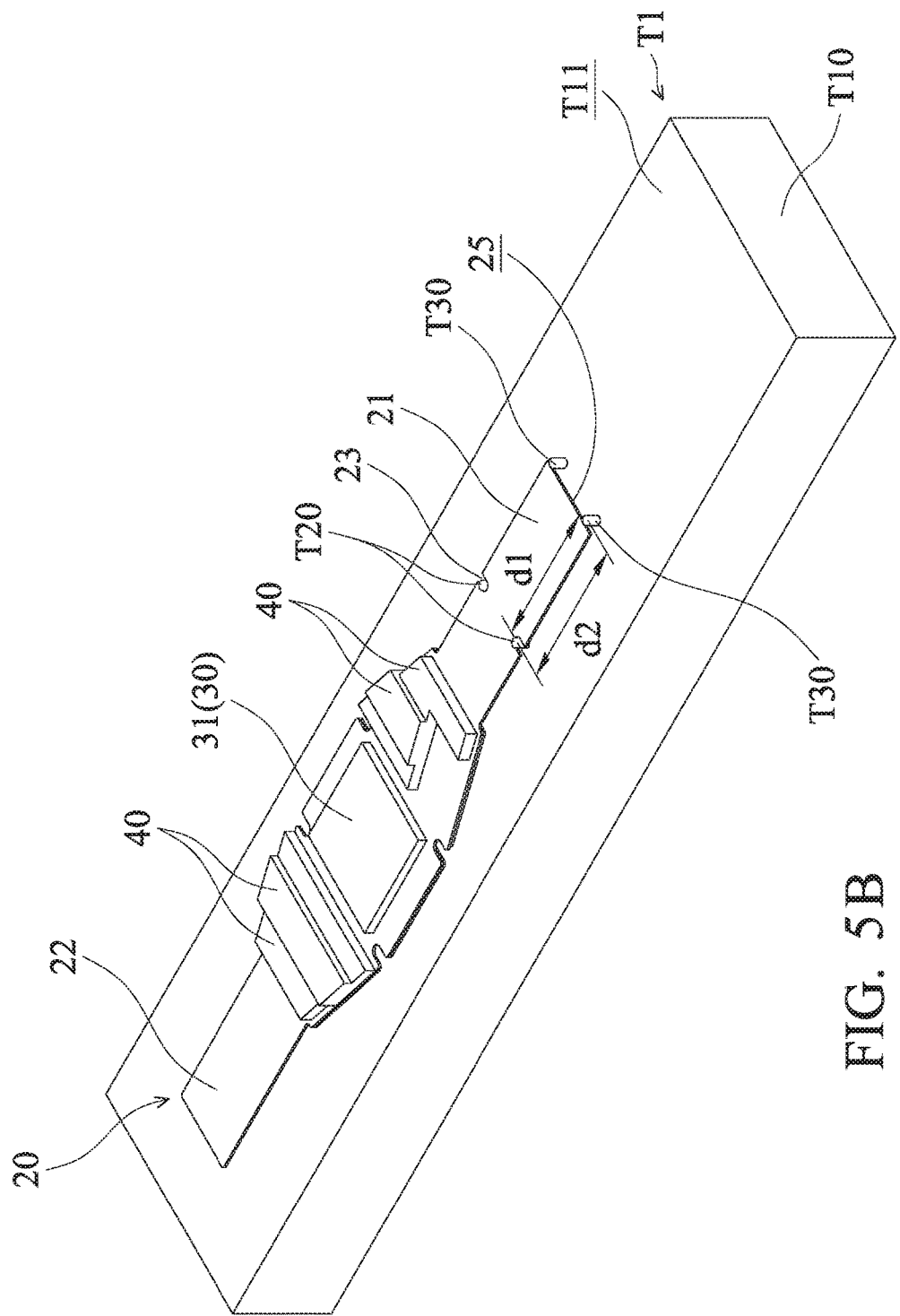

As shown in FIG. 5B, after the first flexible circuit board 20 is cut by the cutting tool T2, the first flexible circuit board 20 can be flattened on the support surface T11, and the end surface 25 of the first flexible circuit board 20 faces or adjacent to the second position pillar T30. In the other words, the first flexible circuit board 20 is parallel to or is flat on the support surface T11. The distance d1 between the first positioning hole 23 and the end surface 25 is smaller or equal to the distance d2 between the first position pillar T20 and the second position pillar T30. The distances d1 and d2 are measured in a direction parallel to the support surface T11.

Figure 5C:
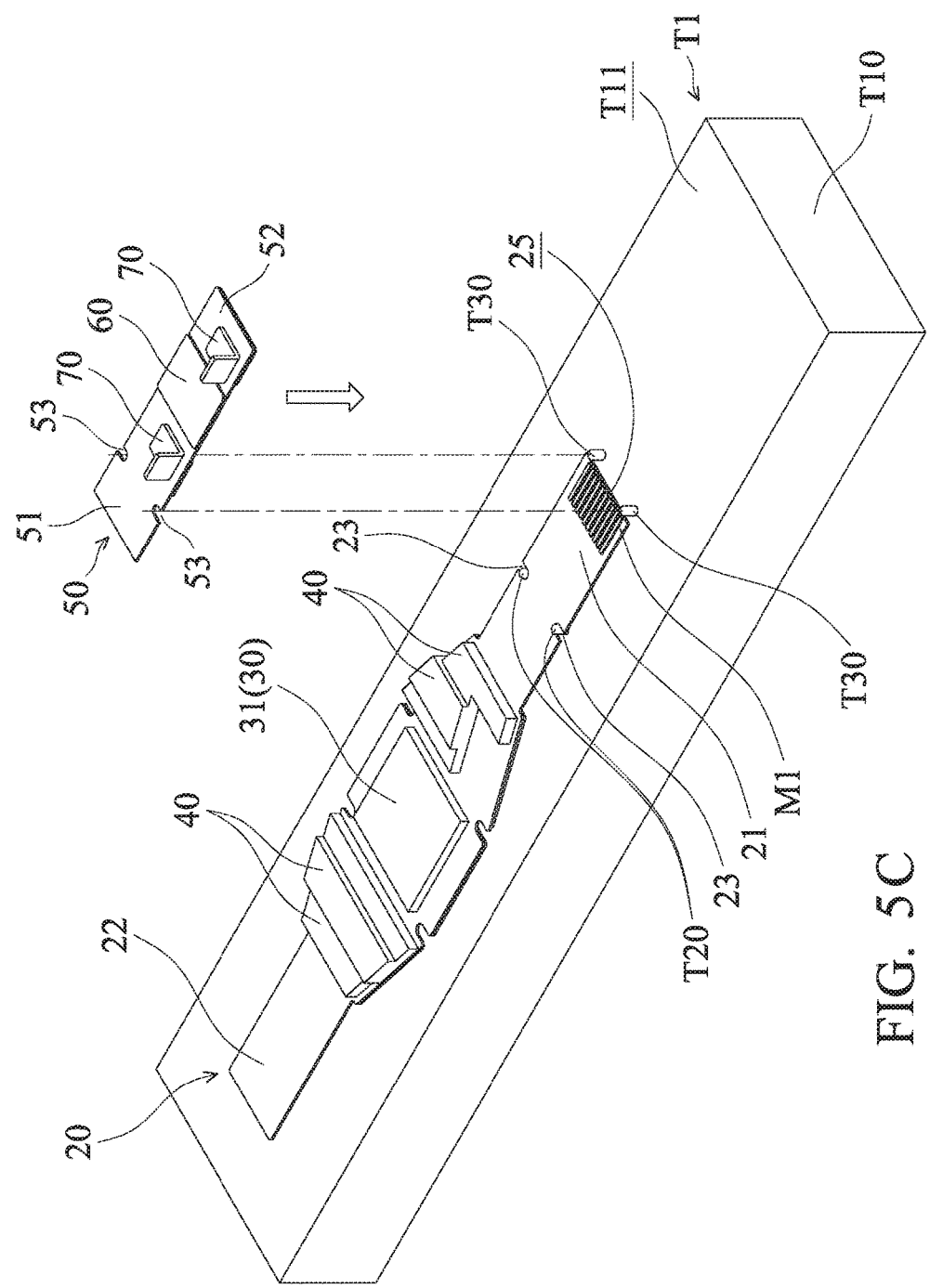

In step S105, as shown in FIG. 5C, the second flexible circuit board 50 is put on the support surface T11, and the second flexible circuit board 50 is moved to make the second position pillar T30 on the support surface T11 to be located in the second positioning hole 53. When both of the first flexible circuit board 20 and the second flexible circuit board 50 are put on the support surface T11, the first connection end 21 of the first flexible circuit board 20 and the second connection end 51 of the second flexible circuit board 50 are overlapped.

In step S107, a conductive material M1 is disposed to electrically connect the first connection end 21 of the first flexible circuit board 20 and the second connection end 51 of the second flexible circuit board 50. In this embodiment, as shown in FIG. 5C, the conductive material M1 is disposed on the first connection end 21. After both of the first flexible circuit board 20 and the second flexible circuit board 50 are put on the support surface T11, the first flexible circuit board 20 is electrically connected to the second flexible circuit board 50 via the conductive material M1, and the first connection end 21 is fixed on the second connection end 51 via the conductive material M1.

Figure 5D:
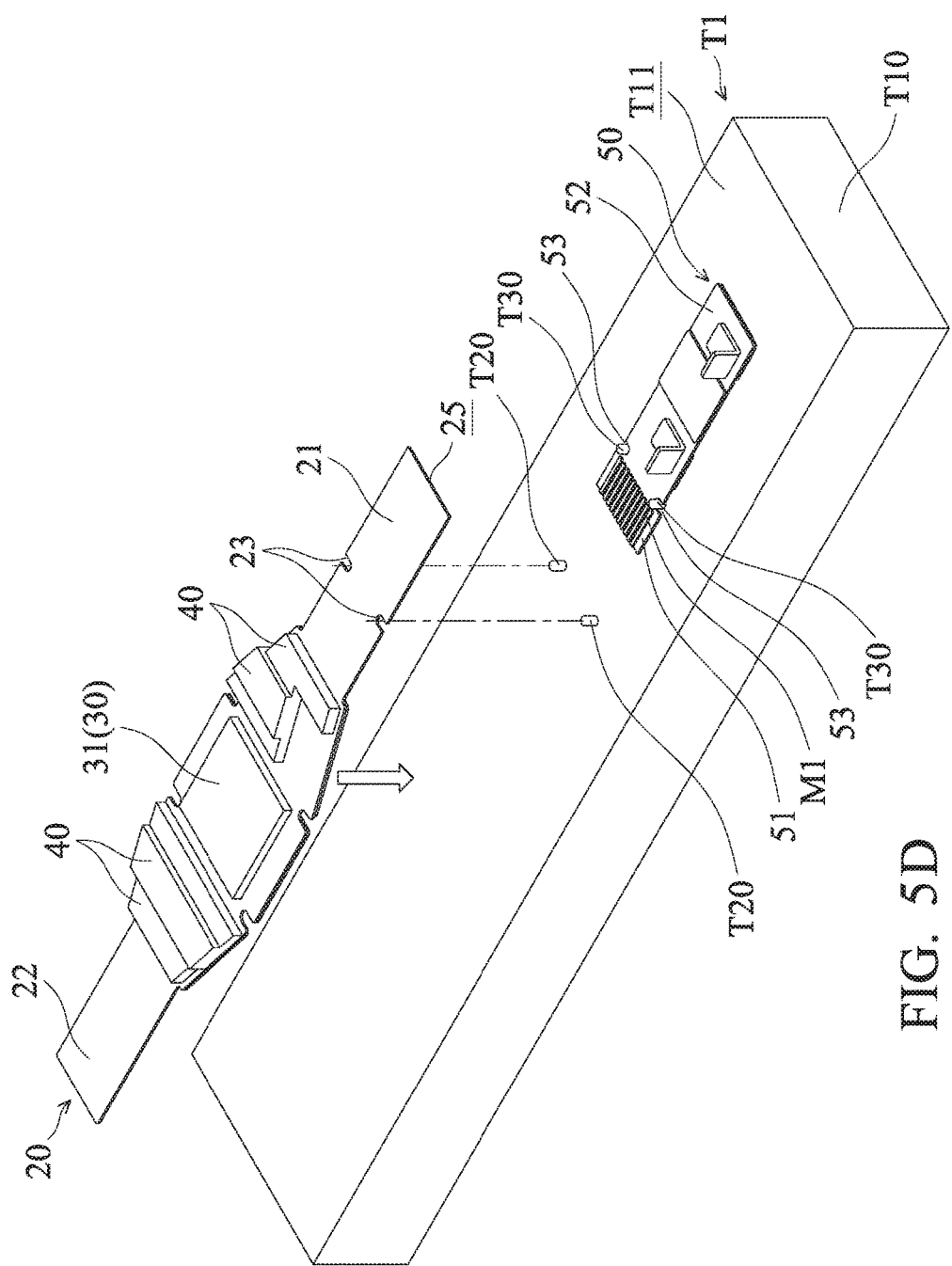

In some embodiments, as shown in FIG. 5D, in step S105, the first flexible circuit board 20 is removed from the support surface T11, and then the second flexible circuit board 50 is put on the support surface T11. After the second flexible circuit board 50 is put on the support surface T11, the first flexible circuit board 20 is put on the support surface T11. In step S107, the conductive material M1 is disposed on the second connection end 51.

Figure 5E:
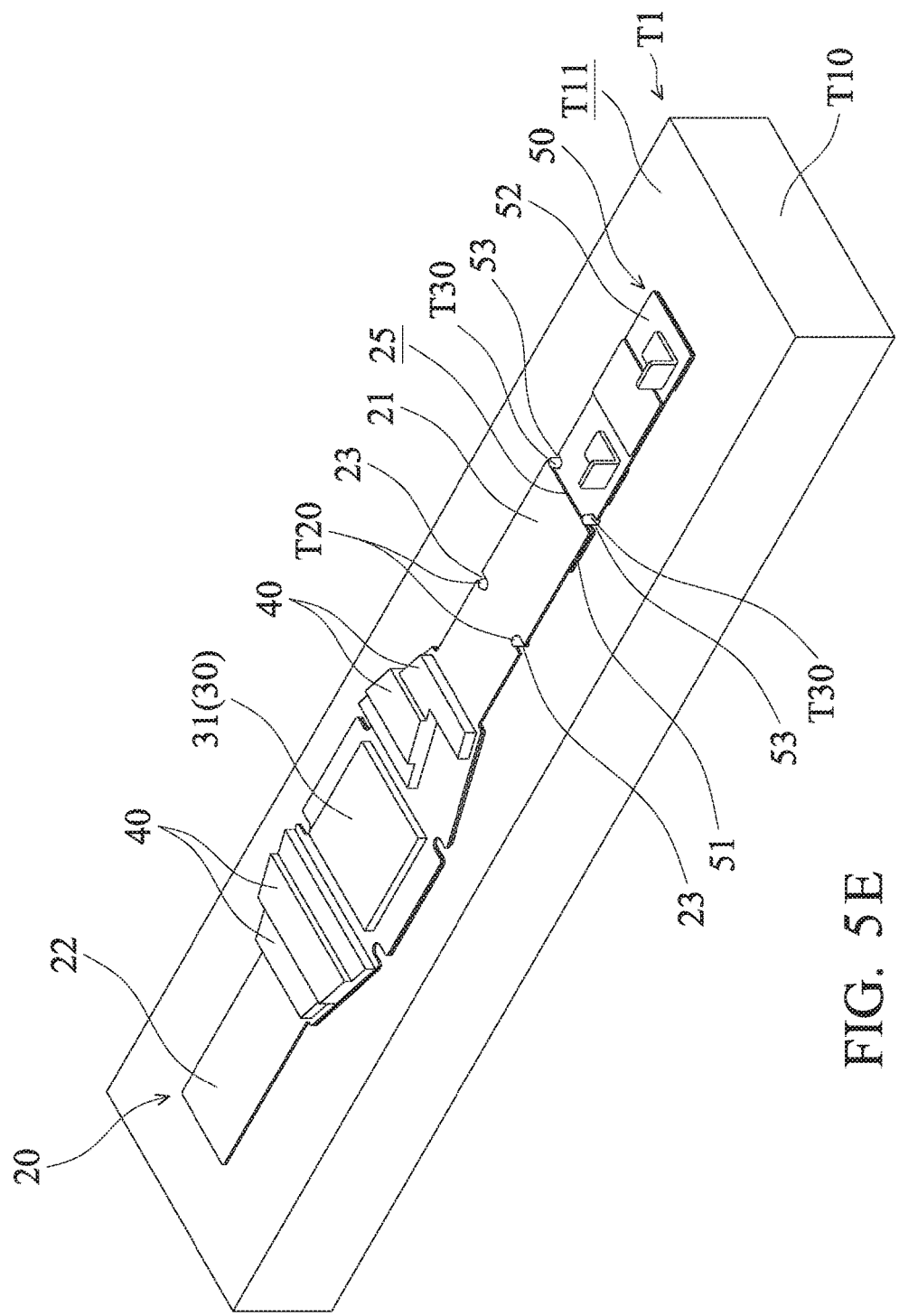

As shown in FIG. 5E, when the first flexible circuit board 20 and the second flexible circuit board 50 are put on the support stage T10, the first position pillar T20 are located in the first positioning hole 23, the second position pillar T30 are located in the second positioning hole 53, and the first connection end 21 of the first flexible circuit board 20 and the second connection end 51 of the second flexible circuit board 50 are overlaid and connected to each other.

In the present disclosure, the flexible circuit boards can correspond to the annular housings 10 of various sizes by connecting the second flexible circuit board 50 with the cut first flexible circuit board 20. For example, the length of cutting the first flexible circuit board 20 is decreased by increasing the distance d2 between the first position pillar T20 and the second position pillar T30. Therefore, the connection of the cut first flexible circuit board 20 and the second flexible circuit board 50 is longer and can correspond to a larger annular housing 10.

Similarly, the size of cutting the first flexible circuit board 20 is increased by short the distance d2 between the first position pillar T20 and the second position pillar T30. Therefore, the length of the connection of the cut first flexible circuit board 20 and the second flexible circuit board 50 is shorter, and thus the connection of the cut first flexible circuit board 20 and the second flexible circuit board 50 can correspond to a smaller annular housing 10.

In conclusion, using manufacturing method of the flexible circuit board for the wearable electronic device, the relative positions of the first electronic element and the second electronic element on the annular housing can be adjusted by cutting various length of the first flexible circuit board. Therefore, it is not required to design various first flexible circuit boards of different sizes and circuits for annular housings of various sizes, and thus the manufacturing cost of the wearable electronic device is decreased.

The disclosed features may be combined, modified, or replaced in any suitable manner in one or more disclosed embodiments, but are not limited to any particular embodiments.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A wearable electronic device, comprising:
an annular housing, extending along an annular path, comprising a first receiving portion and a second receiving portion separately arranged in the annular path;
a first flexible circuit board, disposed in the annular housing;
a first electronic element, disposed on the first flexible circuit board, located in the first receiving portion;
a second flexible circuit board, disposed in the annular housing, fixed on the first flexible circuit board; and
a second electronic element, disposed on the second flexible circuit board, and located in the second receiving portion;
wherein the first electronic element is electrically connected to the second electronic element via the first flexible circuit board and the second flexible circuit board.

2. The wearable electronic device as claimed in claim 1, wherein the annular housing is surrounding a hollow space, the second receiving portion faces the first receiving portion, and the hollow space is located between the first receiving portion and the second receiving portion.

3. The wearable electronic device as claimed in claim 1, wherein the first flexible circuit board and the second flexible circuit board respectively extend along the annular path, and are arranged in the annular path.

4. The wearable electronic device as claimed in claim 1, wherein the first flexible circuit board and the second flexible circuit board are elongated structures, and the first flexible circuit board comprises a first connection end, and the second flexible circuit board comprises a second connection end fixed on and electrically connected to the first connection end.

5. The wearable electronic device as claimed in claim 1, wherein the first flexible circuit board comprises a first free end, the second flexible circuit board comprises a second free end, and the first free end and the second free end are separate from each other.

6. The wearable electronic device as claimed in claim 1, further comprising a plurality of electrode terminals, disposed on the second flexible circuit board, electrically connected to the first electronic element.

7. The wearable electronic device as claimed in claim 6, wherein the second electronic element is located between the electrode terminals.

8. The wearable electronic device as claimed in claim 1, wherein the first electronic element is a cell or a central processing chip, and the second electronic element is a pulse sensor.

9. The wearable electronic device as claimed in claim 1, further comprising a third electronic element disposed on the first flexible circuit board.

10. The wearable electronic device as claimed in claim 9, wherein the third electronic element is a sensor.

11. The wearable electronic device as claimed in claim 1, wherein the first flexible circuit board comprises a first positioning hole, and the annular housing comprises a first anchor element located in the first positioning hole.

12. A manufacturing method of a flexible circuit board for a wearable electronic device, comprising:
putting a first flexible circuit board on a support surface of a support stage, and moving the first flexible circuit board to make a first position pillar on the support surface to be located in a first positioning hole of the first flexible circuit board; and
cutting the first flexible circuit board via a cutting tool, when the first flexible circuit board covers or is in contact with a second position pillar of the support surface.

13. The manufacturing method as claimed in claim 12, wherein after the first flexible circuit board is cut by the cutting tool, a distance between the first positioning hole and an end surface of the first flexible circuit board, which is adjacent to the second position pillar, is shorter than or equal to a distance between the first position pillar and the second position pillar.

14. The manufacturing method as claimed in claim 12, further comprising:
putting a second flexible circuit board on the support surface, and moving the second flexible circuit board to make a second position pillar on the support surface to be located in a second positioning hole of the second flexible circuit board, wherein a first connection end of the first flexible circuit board and a second connection end of the second flexible circuit board are overlapped, when both of the first flexible circuit board and the second flexible circuit board are put on the support surface.

15. The manufacturing method as claimed in claim 14, further comprising:

disposing a conductive material to electrically connect the first connection end and the second connection end.

16. The manufacturing method as claimed in claim 14, further comprising:

removing the first flexible circuit board from the support surface; and putting the first flexible circuit board on the support surface, after the second flexible circuit board is put on the support surface.

17. A fixture of a flexible circuit board for a wearable electronic device, comprising:

a support stage comprising a support surface;

a first position pillar disposed on the support surface; and a second position pillar disposed on the support surface;

wherein the support stage is configured to support a first flexible circuit board and/or a second flexible circuit board, and the first flexible circuit board comprises a first positioning hole, and the second flexible circuit board comprises a second positioning hole, wherein when the first flexible circuit board and the second flexible circuit board are put on the support stage, the first position pillar is located in the first positioning hole, the second position pillar is located in the second positioning hole, and a first connection end of the first flexible circuit board and a second connection end of the second flexible circuit board are overlapped.

18. The fixture as claimed in claim 17, wherein when both of the first flexible circuit board is put on the support stage, a cutting tool cuts the first connection end if the first connection end of the first flexible circuit board covers or is in contact with the second position pillar.

19. The fixture as claimed in claim 17, wherein the first positioning hole is located at a side of the first flexible circuit board, and the second positioning hole is located at a side of the second flexible circuit board.

* * * * *